(12) United States Patent
Liao

(10) Patent No.: US 6,711,925 B2
(45) Date of Patent: Mar. 30, 2004

(54) PROCESS FOR MANUFACTURING A CONDUCTIVE WIRE SUITABLE FOR USE IN SEMICONDUCTOR PACKAGES

(75) Inventor: Pen-Tien Liao, Taipei Hsien (TW)

(73) Assignee: Asep Tec Co., Ltd., Taoyuan Hsien (TW)

(*) Notice: Subject to any disclaimer, the term of this patent is extended or adjusted under 35 U.S.C. 154(b) by 0 days.

(21) Appl. No.: 10/023,044

(22) Filed: Dec. 17, 2001

(65) Prior Publication Data

US 2003/0113574 A1 Jun. 19, 2003

(51) Int. Cl.⁷ .............. B32B 15/02; B21C 1/00
(52) U.S. Cl. .............. 72/47; 428/607; 428/672; 427/117; 427/125; 427/357
(58) Field of Search .............. 428/607, 673, 428/672, 670; 72/47; 427/125, 357, 328, 117; 205/222

(56) References Cited

U.S. PATENT DOCUMENTS 6,092,358 A * 7/2000 Grosz .............. 59/35.1
6,261,436 B1 * 7/2001 Chang .............. 205/206

FOREIGN PATENT DOCUMENTS

| DE | 4125980 | * | 2/1993 |
| JP | 51-085669 | * | 8/1979 |
| JP | 56-021354 | * | 2/1981 |
| JP | 64-017436 | * | 1/1989 |
| JP | 01-259541 | * | 10/1989 |
| JP | 04-206646 | * | 7/1992 |
| JP | 11-243111 | * | 9/1999 |
| JP | 2001-196441 | * | 7/2001 |

* cited by examiner

Primary Examiner—John J. Zimmerman
(74) Attorney, Agent, or Firm—Brinks Hofer Gilson & Lione

(57) ABSTRACT

In a process for manufacturing a conductive wire that is suitable for use in semiconductor packages, a core wire of an extensible metal other than gold is first prepared to have a diameter ranging from 300 μm to 500 μm. Thereafter, a gold-containing outer layer having a thickness ranging from 2.5 μm to 25 μm is plated onto an outer surface of the core wire so as to form a gold-plated core wire. Subsequently, the gold-plated core wire is drawn to result in the conductive wire having a diameter ranging from 1 μm to 50 μm.

4 Claims, 3 Drawing Sheets

PROCESS FOR MANUFACTURING A CONDUCTIVE WIRE SUITABLE FOR USE IN SEMICONDUCTOR PACKAGES

BACKGROUND OF THE INVENTION

1. Field of the Invention

The invention relates to a process for manufacturing a conductive wire that is suitable for use in semiconductor packages, more particularly to a process for manufacturing a conductive wire having the effects of reduced cost and good signal transmission. The invention also relates to a conductive wire manufactured by the process.

2. Description of the Related Art

Conventional conductive wires used in semiconductor packages are made of pure gold to achieve high quality signal transmission. However, since pure gold is expensive, it is difficult to reduce the cost for manufacturing the conventional conductive wire.

SUMMARY OF THE INVENTION

Therefore, the object of the present invention is to provide a process for manufacturing a conductive wire that is suitable for use in semiconductor packages and that has the effects of reduced cost and good signal transmission.

Accordingly, the process for manufacturing a conductive wire of the present invention comprises the steps of: preparing a core wire of an extensible metal other than gold, the core wire having a diameter ranging from 300 $\mu$m to 500 $\mu$m and an outer surface; plating a gold-containing outer layer having a thickness ranging from 2.5 $\mu$m to 25 $\mu$m onto the outer surface of the core wire so as to form a gold-plated core wire; and drawing the gold-plated core wire into the conductive wire having a diameter ranging from 1 $\mu$m to 50 $\mu$m.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENTS

Figure 1:
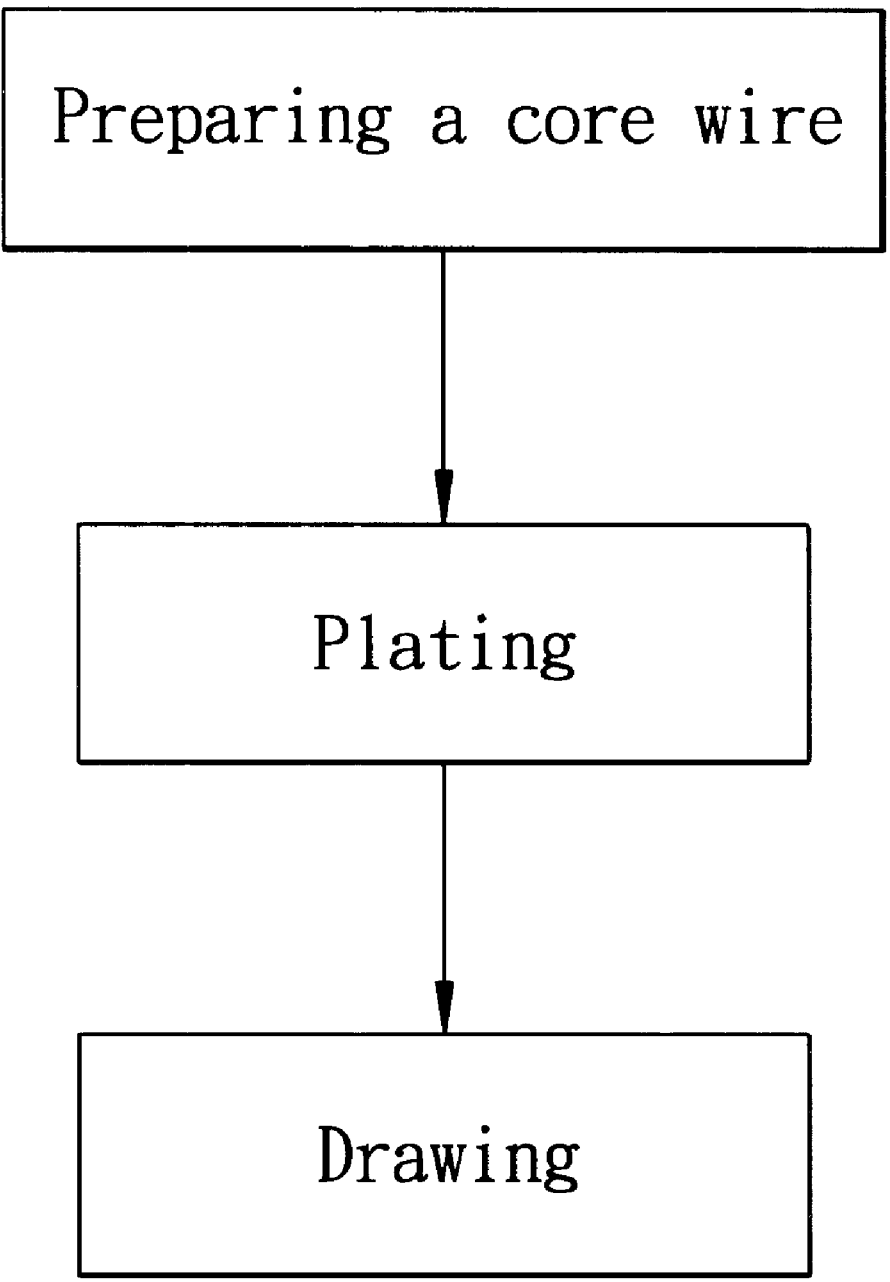
FIG. 1 is a flow diagram of the preferred embodiment of a process for manufacturing a conductive wire according to this invention.
Figure 2:
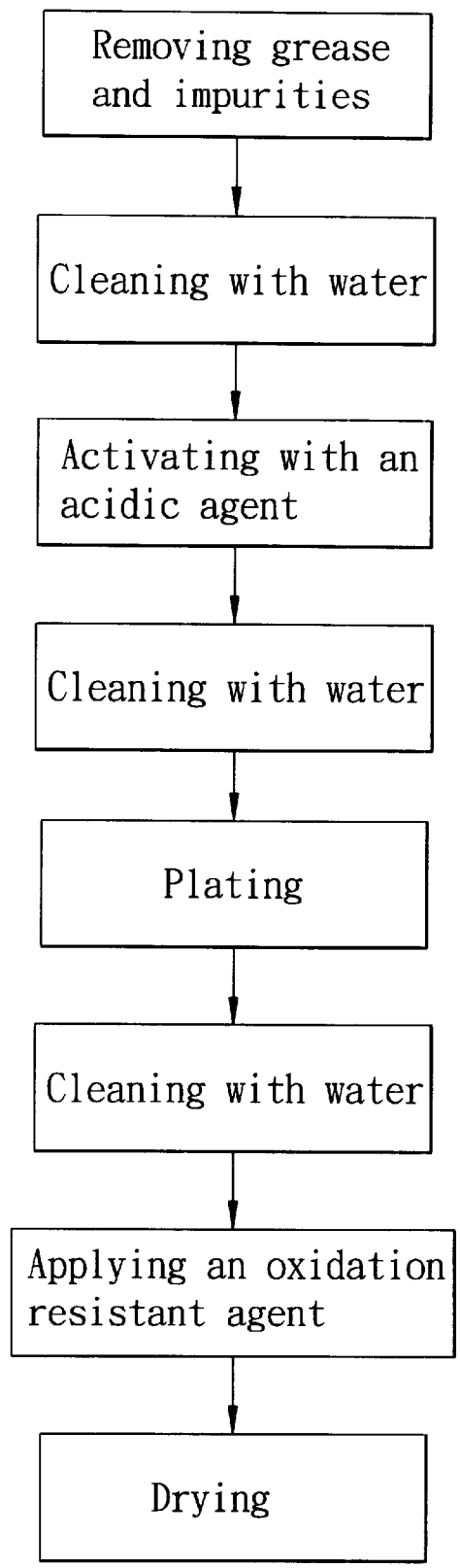
FIG. 2 is a flow diagram of the plating step of FIG. 1.
Figure 3:
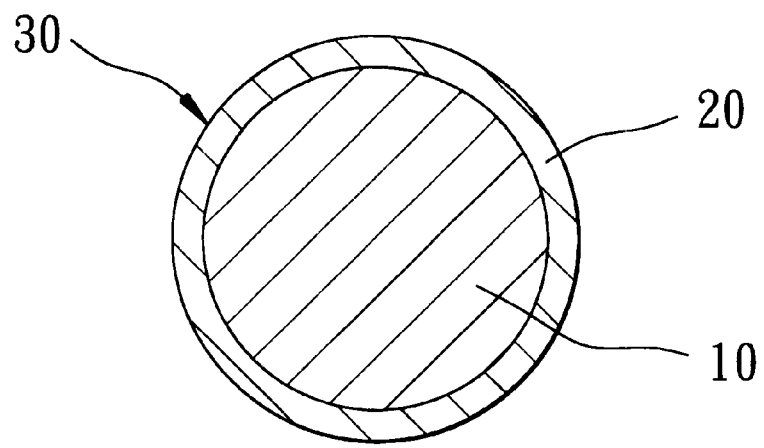
FIG. 3 is a sectional view of a gold-plated core wire.

Referring to FIGS. 1, 2 and 3, the preferred embodiment of the process for manufacturing a conductive wire that is suitable for use in semiconductor packages according to this invention comprises the steps of:

(1) preparing a core wire:

A core wire 10 of an extensible metal other than gold is prepared. The core wire 10 has a diameter ranging from 300 $\mu$m to 500 $\mu$m and an outer surface. In the embodiment, in order to reduce the manufacturing cost, the extensible metal can be selected from the group consisting of silver and palladium. According to test results, silver and palladium have the characteristics of relatively good signal transmission, extensibility and adhesiveness.

(2) plating:

A gold-containing outer layer 20 having a thickness ranging from 2.5 $\mu$m to 25 $\mu$m is plated onto the outer surface of the core wire 10 so as to form a gold-plated core wire 30. The plating step can be conducted by any appropriate technique well known in the art. As an example, a plating process is illustrated in FIG. 2 and includes the steps of:

a) removing grease and impurities from the outer surface of the core wire 10;

b) cleaning the outer surface of the core wire 10 by spraying the core wire 10 with water;

c) activating the outer surface of the core wire 10 with an acidic agent;

d) cleaning the outer surface of the core wire 10 by spraying the core wire 10 with water so as to render the outer surface of the core wire 10 to exhibit good adhesiveness to the gold-containing outer layer 20;

e) plating the gold-containing outer layer 20, which has a thickness ranging from 2.5 $\mu$m to 25 $\mu$m and which is made of above 99.99 weight percent gold, onto the core wire 10 so as to form the gold-plated core wire 30;

f) cleaning the gold-plated core wire 30 by spraying the gold-plated core wire 30 with water so as to render the gold-plated core wire 30 to exhibit good signal transmission and good extensibility; and g) applying an oxidation resistant agent onto an outer surface of the gold-plated core wire 30 so as to protect the gold-plated core wire 30 from oxidation.

Optionally, a drying step (h) can be performed on the gold-plated core wire 30 after step g) using any appropriate technique well known in the art.

Figure 4:
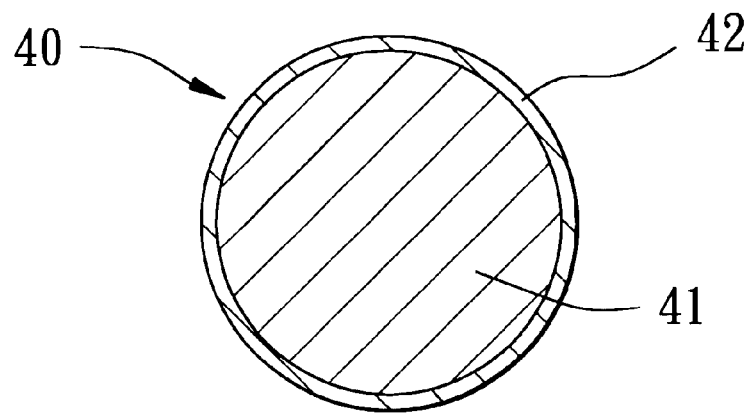
FIG. 4 is a sectional view of the preferred embodiment of the conductive wire according to this invention.

(3) drawing:

The gold-plated core wire 30 is drawn into a conductive wire 40 (shown in FIG. 4), which includes a core wire 41 and a gold-containing outer layer 42 co-axially enclosing and bonded to the core wire 41. The gold-plated core wire 30 has a diameter ranging from 1 $\mu$m to 50 $\mu$m, and the gold-containing outer layer 42 has a thickness ranging from 0.0125 $\mu$m to 2.5 $\mu$m.

Some of the advantages of this invention over the prior art are described as follows:

1. Since the core wire 41 of the conductive wire 40 according to this invention is made of silver or palladium, the manufacturing cost is lower as compared to that of the conventional conductive wire, which is made entirely of pure gold.

2. Since the plating process is conducted on the relatively thick core wire, the risk of breaking of the core wire 10 can be minimized, and the production yield can be increased.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A process for manufacturing a conductive wire suitable for use in semiconductor packages, comprising the steps of:

preparing a core wire of an extensible metal other than gold, said core wire having a diameter ranging from 300 $\mu$m to 500 $\mu$m and an outer surface;

plating a gold-containing outer layer having a thickness ranging from 2.5 μm to 25 μm onto said outer surface of said core wire so as to form a gold-plated core wire; and drawing said gold-plated core wire into said conductive wire having a diameter ranging from 1 μm to 50 μm such that said gold-containing outer layer has a thickness ranging from 0.0125 μm to 2.5 μm after said drawing step.

2. The process as claimed in claim 1, wherein said extensible metal is selected from the group consisting of silver and palladium.

3. The process as claimed in claim 1, wherein said gold-containing outer layer of said gold-plated core wire is made of above 99.99 weight percent gold.

4. The process as claimed in claim 1, wherein said plating step is conducted by the steps of:

removing grease and impurities from said outer surface of said core wire;

cleaning said outer surface of said core wire by spraying said core wire with water;

activating said outer surface of said core wire with an acidic agent;

cleaning said outer surface of said core wire by spraying said core wire with water;

plating said gold-containing outer layer onto said core wire so as to form said gold-plated core wire;

cleaning said gold-plated core wire by spraying said gold-plated core wire with water; and applying an oxidation resistant agent onto an outer surface of said gold-plated core wire so as to protect said gold-plated core wire from oxidation.

* * * * *